US009698530B1

(12) United States Patent
Chang

(10) Patent No.: US 9,698,530 B1
(45) Date of Patent: Jul. 4, 2017

(54) ELECTRONIC APPARATUS HAVING STRUCTURES FOR FASTENING AND PROTECTING CONNECTORS

(71) Applicant: JET OPTOELECTRONICS CO., LTD., Taipei (TW)

(72) Inventor: Yung-Tse Chang, Taipei (TW)

(73) Assignee: JET OPTOELECTRONICS CO., LTD., Taipei (TW)

( * ) Notice: Subject to any disclaimer, the term of this patent is extended or adjusted under 35 U.S.C. 154(b) by 0 days.

(21) Appl. No.: 15/188,569

(22) Filed: Jun. 21, 2016

(51) Int. Cl.
*H01R 13/639* (2006.01)
*H05K 5/02* (2006.01)

(52) U.S. Cl.
CPC ......... *H01R 13/639* (2013.01); *H05K 5/0217* (2013.01); *H05K 5/0247* (2013.01)

(58) Field of Classification Search
CPC ............ H01R 13/6456; H01R 12/7005; H05K 5/0247
USPC .......................................................... 439/374
See application file for complete search history.

(56) References Cited

U.S. PATENT DOCUMENTS 6,190,194 B1 * 2/2001 Kubota ................ H01R 13/631 439/378

* cited by examiner

*Primary Examiner* — Ross Gushi
(74) *Attorney, Agent, or Firm* — Rabin & Berdo, P.C.

(57) ABSTRACT

An electronic apparatus having structures for fastening and protecting connectors includes a main body and at least one transmission member. The main body includes an assembling portion, at least one connecting port and at least one retaining groove. The assembling portion is formed at one edge on a sidewall of the main body and has an installing surface and a setting surface. The connecting port is disposed on the installing surface of the assembling portion. The retaining groove is formed on the setting surface of the assembling portion and corresponds in position to the connecting port. The transmission member includes an output connector and a retaining block. The output connector is detachably plugged in the connecting port of the main body. The retaining block protrudes from one side of the output connector and is capable of being engaged in the retaining groove of the main body.

4 Claims, 5 Drawing Sheets

ELECTRONIC APPARATUS HAVING STRUCTURES FOR FASTENING AND PROTECTING CONNECTORS

BACKGROUND OF THE INVENTION

1. Field of the Invention

The present invention relates to an electronic apparatus, and more particularly to an electronic apparatus having structures for fastening and protecting connectors.

2. Description of Related Art

A conventional display apparatus, such as a monitor or a flat screen display, is electrically connected with an external signal source via a transmission cable. A connector of the transmission cable may be a HDMI connector or a USB connector. The user may connect the connector of the transmission cable with a corresponding connecting port on the display apparatus to achieve signal transmission between the display apparatus and the external signal source.

However, the user may not accurately connect the connector of the transmission cable with the connecting port of the display apparatus. Normally, the user has to try a couple of times to connect the transmission cable with the connecting port of the display apparatus. When the connector of the transmission cable is unplugged from the connecting port of the display apparatus, the user usually pulls the transmission cable to unplug the connector of the transmission cable from the connecting port of the display apparatus. Moreover, some of the users may pull the transmission cable from the connecting port of the display apparatus via an arbitrary angle, so the damage of the transmission cable and the connector may occur. Therefore, signal transmission between the signal source and the display apparatus may be affected and money may be wasted to maintain the transmission cable or purchase a new cable.

Accordingly, since the user may improperly pull the transmission cable from the connecting port of the display apparatus to cause the damage of the connector and the connecting port, the conventional display apparatus is required to be improved.

SUMMARY OF THE INVENTION

An objective of the present invention is to implement the electronic apparatus with structures for fastening and protecting connectors to limit a pulling motion between a connector and a connecting port. The arbitrary unplug motion from a user can be avoided. Therefore, damage in the connector and the connecting port caused by improper usage may be avoided.

In order to achieve the aforementioned purpose in the present invention, an electronic apparatus having structures for fastening and protecting connectors comprises a main body and at least one transmission member. The main body includes an assembling portion, at least one connecting port, and at least one retaining groove. The assembling portion is formed at one edge on a sidewall of the main body and has an installing surface and a setting surface. The at least one connecting port is disposed on the installing surface of the assembling portion. The at least one retaining groove is formed on the setting surface of the assembling portion and corresponds in position to the at least one connecting port. The at least one transmission member includes an output connector and a retaining block. The output connector is detachably plugged in the at least one connecting port of the main body. The retaining block protrudes from one side of the output connector and is capable of being engaged in the at least one retaining groove of the main body.

According to the electronic apparatus having structures for fastening and protecting connectors, the at least one retaining groove of the main body includes a positioning portion, an opening portion and two latching blocks. The positioning portion is located at a first end of the at least one retaining groove adjacent to the at least one connecting port. The opening portion is located at a second end of the at least one retaining groove, and the second end is opposite to the first end and away from the positioning portion. The two latching blocks correspond in position to the positioning portion and respectively protrude from two sidewalls on the at least one retaining groove. A coupling groove is formed between each of the two latching blocks and a bottom surface of the at least one retaining groove. A gap is formed between the two latching blocks, and a width of the gap is less than the opening portion thereof.

According to the electronic apparatus having structures for fastening and protecting connectors, the retaining block of the at least one transmission member includes a base and two coupling portions. A first end of the base is fastened in a sidewall of the output connector and is capable of being inserted into the gap between the two latching blocks. The two coupling portions respectively protrude on a top and a bottom at a second end of the base and are parallel to the sidewall of the output connector. A distance is formed between each of the two coupling portions and the sidewall of the output connector. The second end of the base is opposite to the first end of the base, and is capable of being inserted into the opening portion of the at least one retaining groove.

According to the electronic apparatus having structures for fastening and protecting connectors, the two coupling portions are capable of being engaged with the coupling groove between the bottom surface of the at least one retaining groove and each of the two latching blocks, and located in the positioning portion, and the two coupling portions capable of being attached to the two latching blocks.

According to the electronic apparatus having structures for fastening and protecting connectors, the installing surface is perpendicular to the setting surface.

The advantage of the present invention is to develop the retaining groove in the main body to operate in coordination with the retaining block of the transmission member. Therefore, during the assembling procedure of the output connector and the connecting port of the main body, the output connector is easy to be located in the connecting port by the retaining guiding from the retaining block and the retaining groove. Moreover, during unplugging of the output connector from the connecting portion of the main body, because of the retaining function from the retaining block and the retaining groove, the pulling direction of the output connector is restricted and the pulling direction is limited to be parallel to the retaining groove. The arbitrary pulling operation from the user can be avoided and the damage of the output connector and the connecting port may be avoided.

DETAILED DESCRIPTION OF THE PREFERRED EMBODIMENT

These and other aspects of the embodiments herein will be better appreciated and understood when considered in conjunction with the following description and the accompanying drawings.

Figure 1:
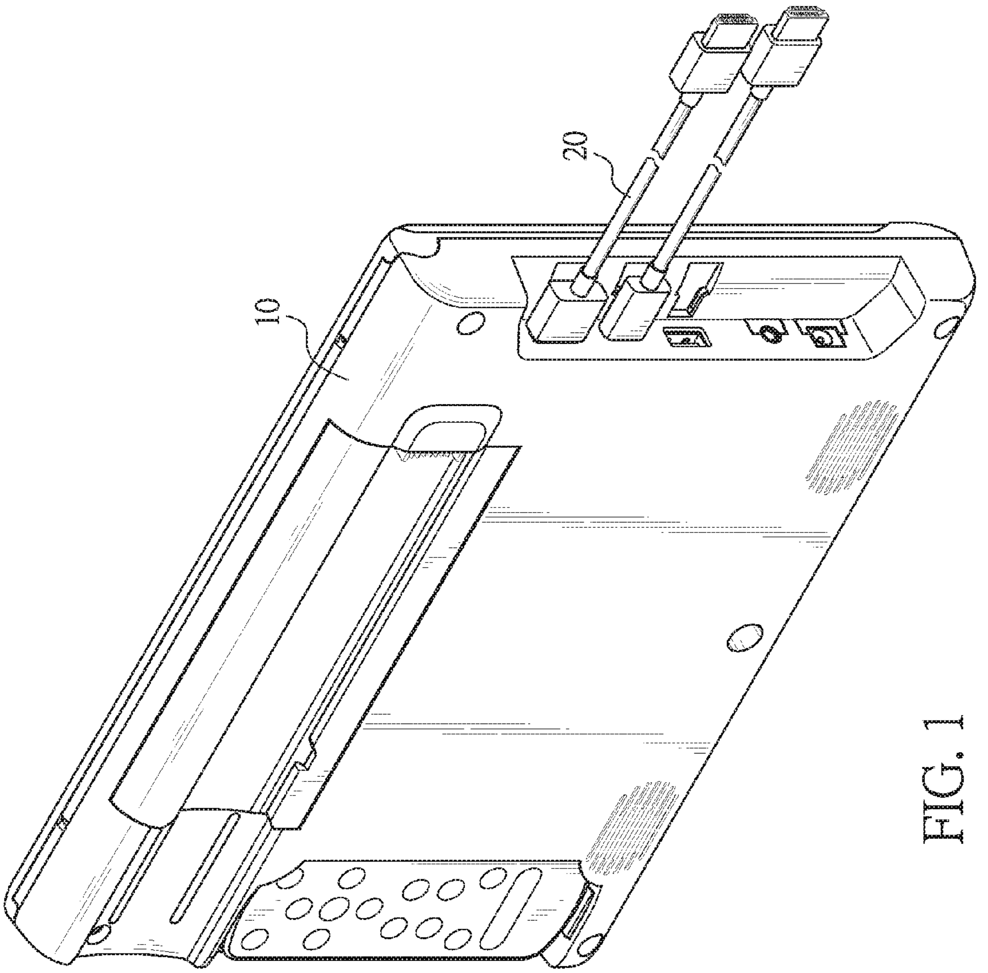
FIG. 1 is a perspective view of an electronic apparatus in an embodiment of the present invention.

With reference to FIG. 1, an electronic apparatus for fastening and protecting connectors in the present invention includes a main body 10 and at least one transmission member 20. As an example, the main body 10 may be a display or a monitor, and the transmission member 20 is a data transmission cable used as a transmission medium between the main body 10 and an external information source.

Figure 2:
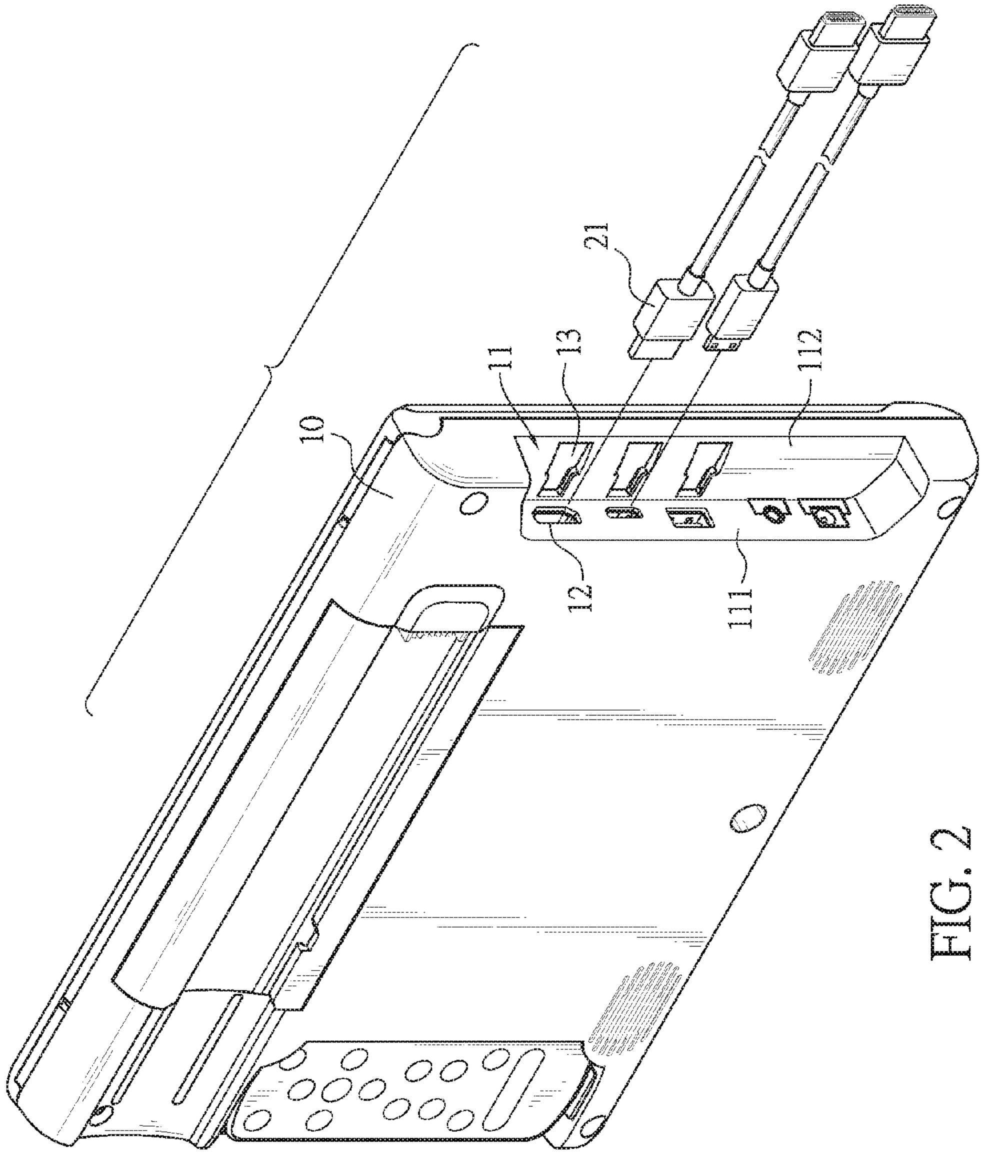
FIG. 2 is an exploded view of a main body and a transmission member of the electronic apparatus in the embodiment of the present invention.
Figure 3:
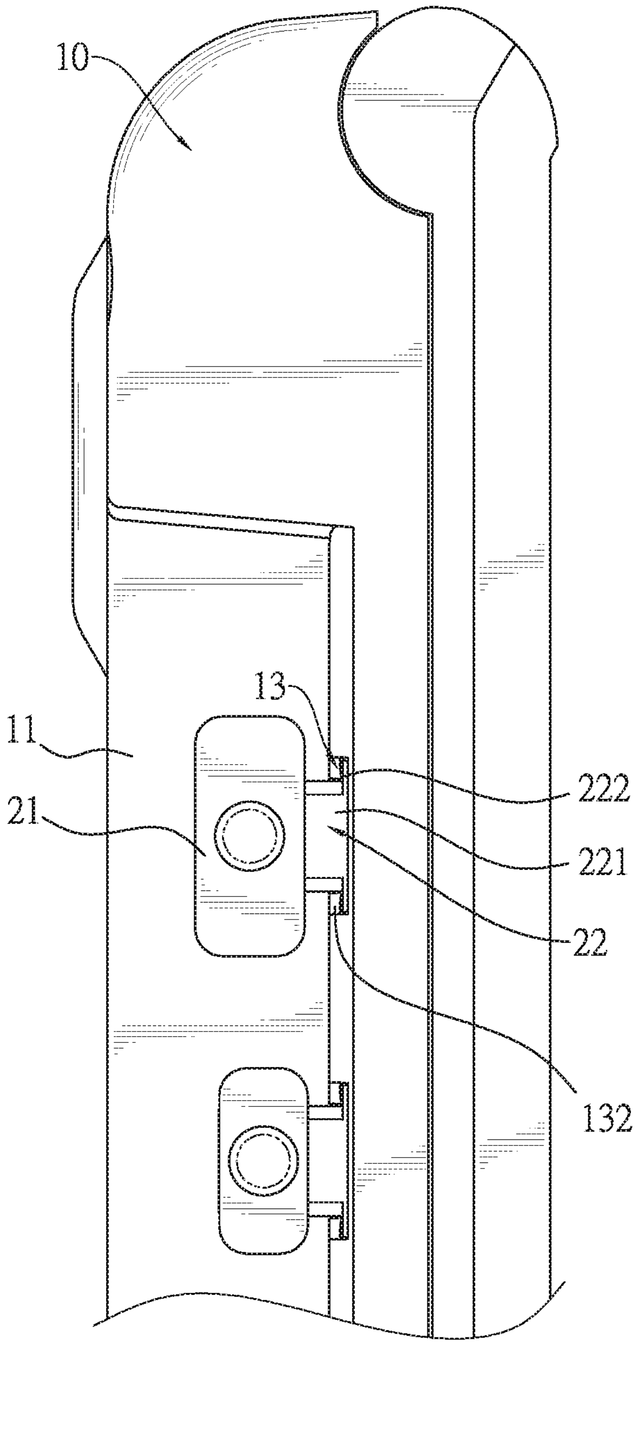
FIG. 3 is a sectional view of the electronic apparatus in the embodiment of the present invention.
Figure 4:
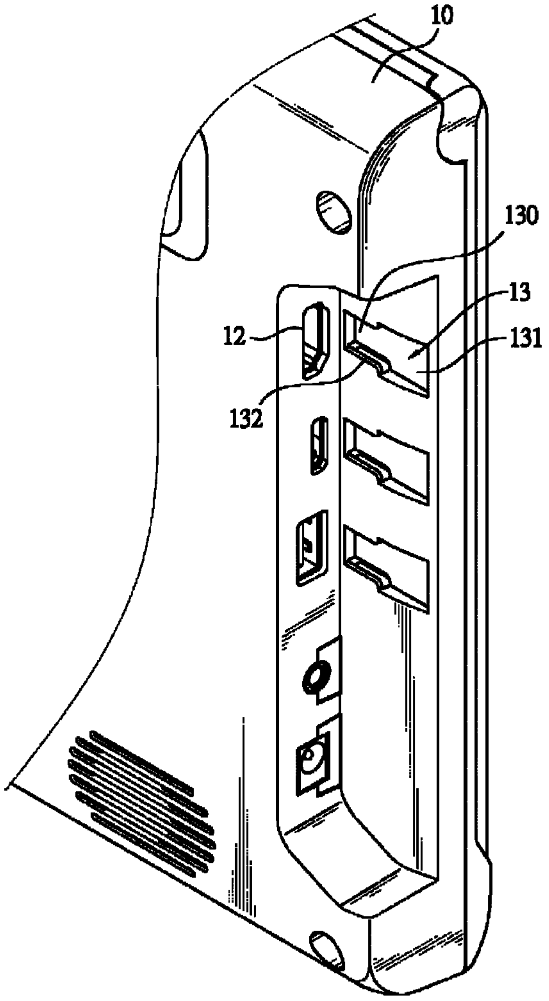
FIG. 4 is a partial perspective view of the main body of the electronic apparatus in the embodiment of the present invention.

With reference to FIG. 2 to FIG. 4, the main body 10 includes an assembling portion 11, at least one connecting port 12 and at least one retaining groove 13.

The assembling portion 11 is formed at one edge on a sidewall of the main body 10. The assembling portion 11 includes an installing surface 111 and a setting surface 112. The installing surface 111 is perpendicular to the setting surface 112.

The connecting port 12 is disposed on the installing surface 111 of the assembling portion 11 and meets a transmission protocol standard.

The retaining groove 13 is formed on the setting surface 112 of the assembling portion 11 and is adjacent to the connecting port 12. The retaining groove 13 includes an opening portion 131, two latching blocks 132, and a positioning portion 130.

The positioning portion 130 is located at a first end of the at least one retaining groove 13 close to the at least one connecting port 12.

The opening portion 131 is located at a second end of the at least one retaining groove 13, and the second end is opposite to the first end and away from the positioning portion 130.

The two latching blocks 132 correspond in position to the positioning portion 130. The two latching blocks 132 respectively protrude from two sidewalls. A gap is formed between the two latching blocks 132 and a width of the gap is less than a width of the opening portion 131. A coupling groove is formed between each of the two latching block 132 and a bottom surface of the retaining groove 13.

Figure 5:
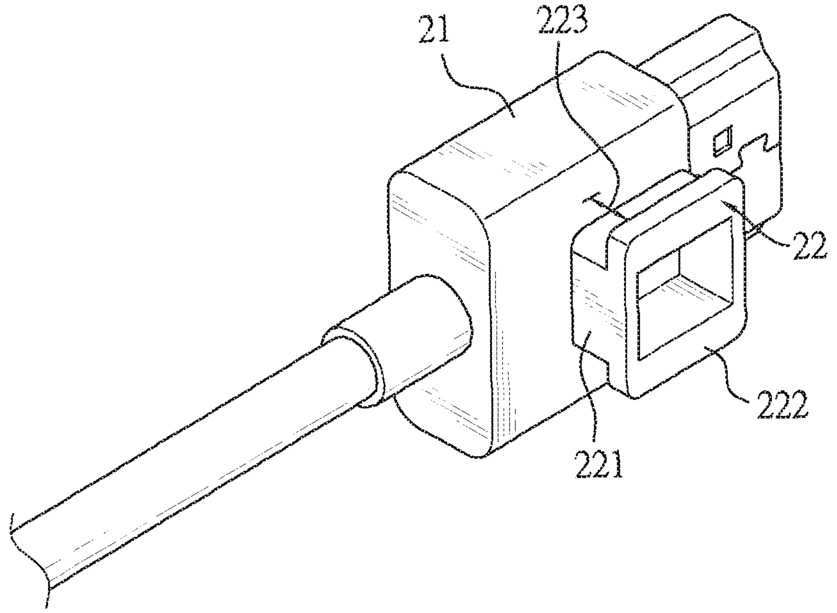
FIG. 5 is a perspective view of an output connector in the embodiment of the present invention.

With reference to FIG. 2, FIG. 3 and FIG. 5, the transmission member 20 includes an output connector 21 and a retaining block 22.

The output connector 21 is detachably connected with the connecting port 12 of the main body 10. Practically, the standard and the model of the output connector 21 correspond to the connecting port 12 thereof. The type and the model of the output connector 21 may be a HDMI connector or a USB connector. The HDMI connector or the USB connector is the conventional art and the detail thereof is omitted herein.

The retaining block 22 protrudes from one sidewall of the output connector 21 and may be inserted into the retaining groove 13 of the main body 10. The retaining block 22 includes a base 221 and two coupling portions 222.

A first end of the base 221 is fastened in one sidewall of the output connector 21, and the first end of the base 221 is capable of being engaged in the gap between the two latching blocks.

The two coupling portions 222 respectively protrude from a top and a bottom at a second end of the base 221, and the second end is opposite to the first end. The two coupling portions 222 are parallel to the sidewall of the output connector 21. A distance 223 is formed between the coupling portion 222 and the sidewall of the output connector 21. The second end of the base 221 is capable of being inserted into the opening portion 131 of the retaining groove 13. The two coupling portions 222 are capable of being engaged in the two coupling grooves between the bottom surface of the retaining groove 13 and the latching block 132 and located in the positioning portion 130. The two coupling portions 222 are capable of being abutted against the two latching blocks 132.

During the installation procedure of the embodiment of the present invention, the second end of the base 221 may be inserted into the opening portion 131 of the retaining groove 13. Therefore, the user may attach the retaining block 22 to the retaining groove 13 and then push the retaining block 22 toward the positioning portion 130. By the two latching blocks 132, the base 221 of the retaining block 22 may be disposed between the two latching blocks 132. Also, the coupling portions 222 are engaged in the coupling groove between each of the latching blocks 132 and the bottom surface of the retaining groove 13. The latching blocks 132 abut against the two coupling portions 222. Therefore, the output connector 21 is guided by the retaining groove 13 so as to move along a straight direction and the output connector 21 is inserted into the connecting port 12.

Alternatively, when the user would like to unplug the output connector 21 from the connecting port 12, the output connector 21 must be moved backward from the positioning portion 130 and the opening portion 131 via the straight direction because the latching blocks 132 abut against the coupling portion 222 of the retaining block 22. Therefore, the operation of the user is limited when unplugging the output connector 21 and the bad operation of the user to arbitrarily pull the output connector 21 via any angles may be corrected.

Since the retaining groove 13 of the main body 10 in the embodiment of the present invention is correspondingly engaged with the retaining block 22 of the transmission member 20, the output connector 21 is guided to move via the straight direction according to a retaining relationship between the retaining block 22 and the retaining groove 13 during the procedure for assembling the output connector 21 and the connecting port 12 of the main body 10. Therefore, the output connector 21 is easy to be positioned and connected with the connecting port 12. Also, when the output connector 21 is unplugged from the connecting port 12, the positioning manner formed by the retaining relationship between the retaining block 22 and the retaining groove 13 limits the unplugging direction of the output connector 21. Accordingly, when the user pulls the output connector 21 from the connecting port 12, the output connector 21 may be only moved away from the connecting port 12 via the straight direction. The arbitrary pulling operation from the user can be avoided and the damage of the output connector 21 and the connecting port 12 may be avoided.

While the present invention has been described in terms of what are presently considered to be the most practical and preferred embodiments, it is to be understood that the present invention need not be restricted to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. An electronic apparatus having structures for fastening and protecting connectors, the electronic apparatus comprising:

a main body including:

an assembling portion formed at one edge on a sidewall of the main body and having an installing surface and a setting surface;

at least one connecting port disposed on the installing surface of the assembling portion; and at least one retaining groove formed on the setting surface of the assembling portion and corresponding in position to the at least one connecting port, wherein each of the at least one retaining groove includes:

a positioning portion located at a first end of the retaining groove, and the first end of the retaining groove is adjacent to a corresponding connecting port;

an opening portion located at a second end of the retaining groove, wherein the second end of the retaining groove is opposite to the first end of the retaining groove and is distal to the corresponding connecting port; and two latching blocks corresponding in position to the positioning portion and respectively protruding from two sidewalls on the retaining groove, wherein a gap is formed between the two latching blocks, and a width of the gap is less than a width of the opening portion; and at least one transmission member, each of the at least one transmission member including:

an output connector detachably plugged in a corresponding connecting port of the main body; and a retaining block protruding from one side of the output connector and capable of being engaged with a corresponding retaining groove of the main body.

2. The electronic apparatus as claimed in claim 1, wherein the retaining block of each of the at least one transmission member includes:

a base having a first end and a second end, wherein the first end of the base is fastened in a sidewall of the output connector of the transmission member and is capable of being inserted into the gap between the two latching blocks of the corresponding retaining groove; and two coupling portions respectively protruding on a top and a bottom at the second end of the base and parallel to the sidewall of the output connector of the transmission member with a distance formed between each of the two coupling portions and the sidewall of the output connector, wherein the two coupling portions are capable of being inserted into a coupling groove and the coupling groove is formed between each of the two latching blocks and a bottom surface of the corresponding retaining groove;

wherein the second end of the base is opposite to the first end of the base, and is capable of being inserted into the opening portion of the corresponding retaining groove.

3. The electronic apparatus as claimed in claim 2, wherein when the two coupling portions are engaged in the coupling groove, the two coupling portions are located in the positioning portion and respectively abut against the two latching blocks.

4. The electronic apparatus as claimed in claim 1, wherein the installing surface is perpendicular to the setting surface.

* * * * *